United States Patent [19]

Audier

[11] Patent Number: 4,866,496
[45] Date of Patent: Sep. 12, 1989

[54] CHARGER TRANSFER DEVICE (CTD), ELIMINATING THE BACKGROUND LEVEL OF A DETECTED SIGNAL, DETECTION STRUCTURE AND METHOD OF USING SUCH A CTD

[75] Inventor: Marcel-Francis Audier, Paris, France

[73] Assignee: U.S. Philips Corp., New York, N.Y.

[21] Appl. No.: 61,234

[22] Filed: Jun. 12, 1987

[30] Foreign Application Priority Data

Jun. 24, 1986 [FR] France ................. 86 09087
Feb. 18, 1987 [FR] France ................. 87 02070

[51] Int. Cl.⁴ ................. H01L 29/78; H01L 27/14
[52] U.S. Cl. ................. 357/24; 357/30; 377/60; 377/61; 377/62; 377/63; 358/213.23; 358/213.25; 358/213.26
[58] Field of Search ........... 357/24 LR, 24 M, 24, 357/30 B, 30 G, 30 H; 377/60, 61, 62, 57, 63; 358/213.23, 213.25, 213.26

[56] References Cited

U.S. PATENT DOCUMENTS

| | | | |
|---|---|---|---|
| 4,523,326 | 6/1985 | Hewitt et al. | 357/24 LR |
| 4,539,597 | 9/1985 | Kinoshita et al. | 357/24 LR |
| 4,631,739 | 12/1986 | Handy | 357/24 LR |
| 4,684,800 | 8/1987 | Morse et al. | 357/24 LR |

OTHER PUBLICATIONS

"Hybrid Infrared Focal Plane Arrays" IEEE Transactions on Electron Devices, vol. ED-29, No. 1, p. 3, Jan. 1982.

Primary Examiner—William L. Sikes
Assistant Examiner—Ngan Van Ngo
Attorney, Agent, or Firm—William L. Botjer

[57] ABSTRACT

A charge transfer device (CTD) eliminating the background level of a detected signal provided with an input circuit comprising an injection source (12) and an electrode (16) controlling a storage potential well, which can be subdivided into an evacuation well (18) and an output well (19) separated by the separation potential produced by a separation electrode (27). This CTD is characterized in that its input circuit comprises a floating electrode (25) connected to the separation electrode (27) in order that the separation potential controls the background level and an insulation electrode (28) insulating the reference well (29) from the output well (19), during the measuring operations, the respective dopings under the floating electrode and under the separation electrode being obtained in order that the potential wells situated under each of these respective electrodes have different depths.

11 Claims, 5 Drawing Sheets

CHARGER TRANSFER DEVICE (CTD), ELIMINATING THE BACKGROUND LEVEL OF A DETECTED SIGNAL, DETECTION STRUCTURE AND METHOD OF USING SUCH A CTD

BACKGROUND OF THE INVENTION

The invention relates to a charge transfer device (CTD) eliminating the background level of a detected signal provided with an input circuit and a transfer circuit formed in a semiconductor substrate, the said signal being detected by means of the input circuit, which comprises:
- a charge injection source connected to a charge emitter, which supplies a quantity of charge,
- a control electrode, which permits that the injection source injects this quanity of charge into a sorage potential well of the CTD, whose depth is controlled by a storage electrode,
- the storage well being subdivided into an evacuation well and an output well separated from each other by the separation potential produced by a separation electrode, which permits of retaining in the evacuation well a quantity of charge to be evacuated and of retaining in the output well a quantity representative of the useful signal, which is read by the transfer circuit by means of a transfer electrode and is then conducted to the output of the CTD connected to processing members, while the charge in the evacuation well can be evacuated by means of a zero reset transistor.

It further relates to a detection apparatus or a detection structure comprising several charge transfer devices connected individually to a charge emitter. These devices may be diodes made of $Cd_xHg_{(1-x)}Te$ in order to obtain an infrared detection.

An invention of this kind is known from the publication "Hybrid Infrared Focal Plane Arrays" by Kuen Chow, J. P. Rode, D. H. Seib, J. D. Blackwell, I.E.E.E. Transactions on Electron Devices, Vol. ED-29, No. 1, p. 3, January 1982. This publication describes a focal plane hybrid network for the detection of radiation by means of photovoltaic detectors and bars of CTD's. This network operates at low temperatures to detect infrared radiation. Nevertheless the dynamic range defined as the signal-to-background level ratio S/B is comparatively small at the level of the detector and it has proved to be indispensable to increase this S/B ratio by means of a CTD, whose input circuit(s) is (are) specially designed to attenuate the component relative to the background level of the signal of the detector. Therefore, the signal originating from the detector acts upon the injection source of the CTD to supply electric charge introduced into a storage potential well, which may be subdivided into two wells, i.e. an evacuation well and an output well, in order to isolate in the output well a quantity of charge compatible with the transfer possibilities of the CTD. This is effected by means of a separation electrode, to which a determined and fixed electric voltage is externally applied. This voltage is the same for all the CTD's constituting a detection apparatus comprising several CTD's. The charge contained in the output well is then poured into the transfer circuit of the CTD by means of a transfer electrode, whose potential can be determined to carry out either an operation of separating the excess charge or a simple transfer.

This device permits of increasing the dynamic range, but nevertheless remains insufficient in practice, for the same potential is applied to all the CTD's constituting a detection apparatus with regard to the separation electrodes on the one hand and to the transfer electrodes on the other hand.

Now, each injection source is connected individually to a photovoltaic detector. It is clear that the background level, viewed by each CTD, will be greatly different because of the addition of all the dispersions connected with the chain formed by the photovoltaic detector, the injection source of the CTD, the dimensions of the electrodes, the doping of the semiconductor in the potential well and the threshold voltages.

These dispersions can reach a value of 30% to 50% of the maximum storage capacity of the transfer zone of the CTD.

Each radiation detector analyses a point of a scene and the injected signal then processed by the CTD is subsequently used to recover a picture. These erratic dispersions associated with each path produce a strongly degraded final picture.

Likewise, according to this prior art, in which the said division of the charge and/or the charge is separated, it is not really possible to suppress the influence of the background level.

Therefore, the invention has for its object to eliminate the unfavourable effect of this cumulation of the dispersions associated with each detector, to increase the picture quality and to suppress the background level.

SUMMARY OF THE INVENTION

Therefore, the invention as defined in the opening paragraph is characterized in that the input circuit of the CTD comprises:
- a floating electrode connected to the separation electrode in order that the separation potential controls the background level, this potential being determined during a calibration operation by means of a reference charge emitter, which charges from the storage well the reference well situated under the floating electrode, the dopings under the floating electrode and under the separation electrode, respectively, being obtained in order that the potential wells situated under each of these respective electrodes have different depths,
- and an insulation electrode, which insulates during the measuring operations the reference well from the output well, the latter being discharged beforehand, the useful signal being read by means of the reference well, the floating electrode being charged by means of a transistor connected to a reference potential.

The invention is also characterized in that the semiconductor substrate is an n-channel semiconductor substrate and in that the potential well formed under the floating electrode is deeper than that formed under the separation electrode, this being obtained by overdoping by means of "donor" elements the part of the semiconductor substrate situated just under the floating electrode.

The potential well formed under the floating electrode deeper than that formed under the separation electrode can also be obtained by doping by means of "acceptor" elements the part of the semiconductor substrate situated just under the separation electrode.

The potential well formed under the floating electrode deeper than that formed under the separation electrode can also be obtained by overdoping by means of "donor" elements the part of the semiconductor substrate situated just under the floating electrode, the insulation electrode and the storage electrode exclusive of the part situated under the separation electrode.

The potential well formed under the floating electrode deeper than that formed under the separation electrode can also be obtained by overdoping by means of "donor" elements the part of the semiconductor substrate situated just under the floating electrode, the insulation electrode and the storage electrode, and by doping by means of "acceptor" elements the part of the semiconductor substrate situated just under the separation electrode.

The said charge transfer device can constitute a mono- or bidimensional detection device.

The invention is further characterized in that the method of utilizing such a CTD is characterized in that during a sequence of operations:

firstly a calibration of the evacuation well is effected from a reference radiation, by charging during a given period from the storage well a reference well situated under a floating electrode in order to modify its electric potential and to control the potential of the separation electrode to which it is connected so that the evacuation well is insulated from the output well by a calibrated separation potential, the doping under the floating electrode and under the separation electrode, respectively, being obtained in order that the potential wells situated under each of these respective electrodes have different depths, by means of an insulation electrode, the output well is insulated from the reference well, which is held in the charged state, the evacuation well and the output well are emptied with respect to their charge, secondly, the measurement on the scene to be analysed is carried out by introducing the charge produced by the charge emitter into the injection source, which first fills the evacuation well and then the output well, the quantity of charge of the output well being transferred to the transfer circuit of the CTD so as to be conducted to processing elements.

The automatic correction of the background level according to the invention utilizes the proportionality relation existing between the potential of a floating electrode and the quantity of electric charge accumulated under said electrode. During a calibration operation, all the radiation detectors are subjected to a calibration flux corresponding to the background level to be suppressed. Each storage potential well receives from each detector through each injection source a quantity of charge proportional to the background level received. The potential of the floating electrode is consequently determined and thus imposes its potential on the separation electrode. The latter dissociates the evacuation well from the output well by modifying the separation potential. In order to increase the final signal-to-background level ratio S/B the preceding operation is repeated after having evacuated each time the charge stored in the evacuation well. Thus, the quasi totality of the background level can be eliminated after a few operating cycles. The reference well and the separation potential are then held in the state for each CTD, the output well is insulated from the reference well by the insulation electrode, the evacuation well and the output well are reset to zero and the detection apparatus is ready to carry out the just-mentioned signal measurements. Each evacuation well is recharged from the quantity of charge for which it is proportioned and the excess charge is poured into the output well. At the end of this stage, the charge of each output well is transferred into the transfer circuit of each CTD by means of the transfer electrodes. The outputs of the CTD's are connected to processing members, which supply signals for the final picture.

Preferably, the invention relates to a detection apparatus comprising n CTD's each processing a picture element. These picture elements can be distributed over linear or bidimensional parts of the picture. The charge emitters can form with the detection apparatus a hybrid or monolithic detection structure. A hybrid structure is constituted, for example, by CTD's of silicon and by charge emitters formed by diodes of $Cd_xHg_{1-x}Te$ or InSb. The invention further relates to a single CTD provided with the input circuit described. cl BRIEF DESCRIPTION OF THE DRAWINGS In order that the invention may be readily carried into effect, it will now be described more fully, by way of example, with reference to the accompanying drawing, in which:

FIG. 1 shows a principle circuit diagram of the operation of the input circuit of a CTD according to the prior art;

FIGS. 2A to 2D show a principle circuit diagram of the input of a CTD according to the invention, FIGS. 3A and 3B show two other principle circuit diagrams for realizing the asymmetry of potential according to the invention, FIG. 4 shows a diagrammatic representation of the topology of the input circuit of a CTD according to the invention, FIG. 5 shows a diagrammatic representation of the topology of a detection apparatus for the bidimensional analysis of the picture wells.

DETAILED DESCRIPTION OF THE PREFERRED EMBODIMENTS

Figure 1:
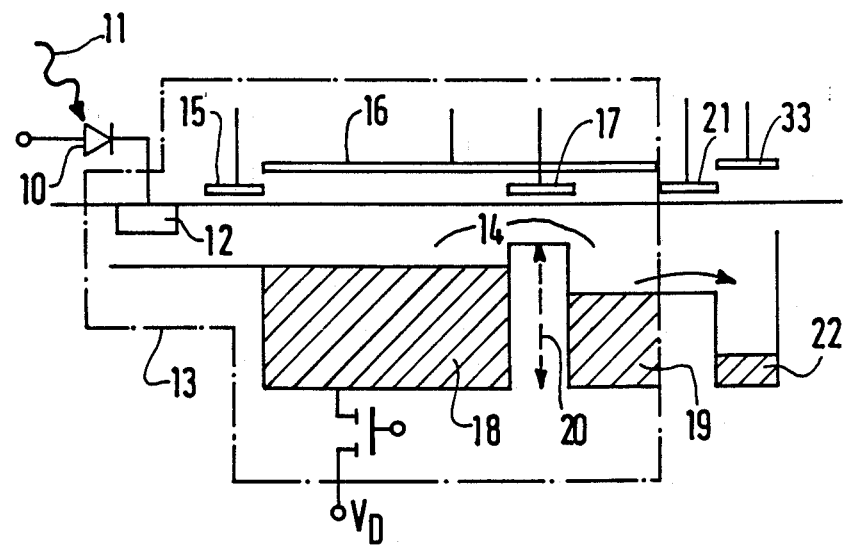

In FIG. 1, the dimensions of the different elements are not shown to scale. The charge emitter 10 receives a radiation 11 originating from a scene to be displayed. This emitter 10 transmits by means of the injection source 12 of the input circuit 13 a quantity of charge to the storage well 14 under the control of the control electrode 15. The storage well 14 is determined with respect to its extent by the dimensions of the storage electrode 16 and with respect to its depth by the electric potential applied to the storage electrode. Under this electrode is situated a separation electrode 17, which permits of reducing the amplification by dividing the storage well 14 into an evacuation well 18 and an output well 19 by modifying the height of the separation potential 20.

In order to carry out the measurement, a given potential insulating from the output well 19 from the evacuation well 18 is applied to the separation electrode 17. The extents of these two wells and their depth and the height of the separation potential 20 are determined for each application in order to increase the signal-to-background level ratio. When the output well 19 has been insulated, the charge contained therein is poured into the transfer well 22 of the transfer circuit of the CTD by means of the transfer electrode 21 and conducted to the output by means of the conventional electrodes, one of which (33) is shown. The potential of the transfer electrode 21 is determined in order to obtain an attenuation of the background level. FIG. 1 shows the situation of the charge in the potential well during the pouring operation.

Figure 2A:
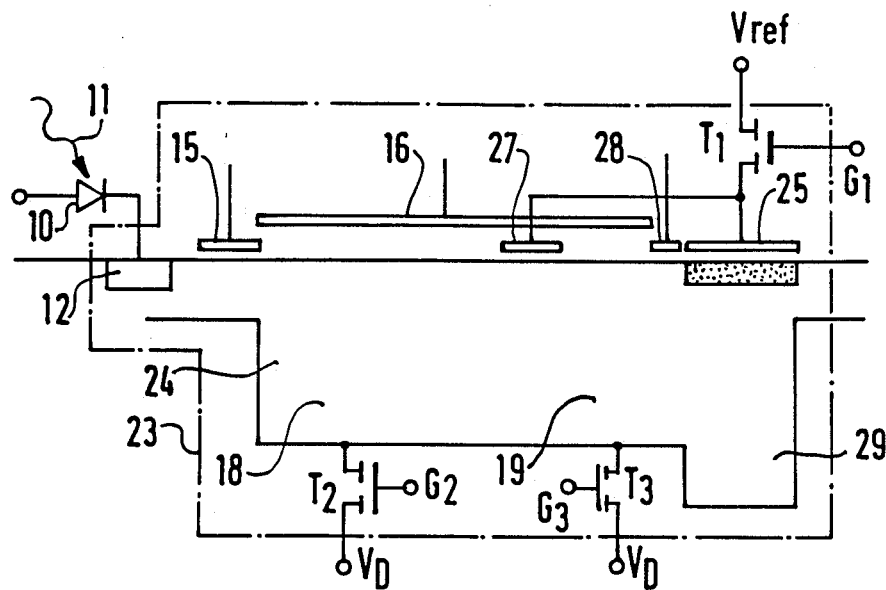

FIGS. 2A to 2D show the CTD according to the invention at different stages of use of the device. FIG. 2A shows it in an initial state, in which the potential wells are devoid of charge.

The input circuit 23 of the CTD comprises the injection source 12, the control electrode 15 and the storage electrode 16. The latter determines by a potential applied the storage well 24, which in FIG. 2A extends under the floating electrode 25, to which a reference voltage Vref is applied through a transistor "T1" provided with a gate G1. The separation electrode 27 electrically connected to the floating electrode 25 is arranged under the storage electrode 16. The potential well 29 under the floating electrode is deeper than the potential well under the electrodes 16 and 27 due to an internal potential obtained, for example for an N-channel device by overdoping, for example by ion implantation by means of "donor" elements, the part of the semiconductor substrate situated just under the floating electrode.

The asymmetry of the potential wells can also be obtained by doping by means of "acceptor" elements the part of the semiconductor substrate situated just under the separation electrode.

It can also be obtained by overdoping by means of "donor" elements the part of the semiconductor substrate situated just under the floating electrode, the insulation electrode and the storage electrode exclusive of the part situated under the separation electrode.

It can also be obtained by overdoping by means of "donor" elements the part of the semiconductor substrate situated just under tee floating electrode, the insulation electrode and the storage electrode and by doping by means of "acceptor" elements the part of the semiconductor substrate situated just under the separation electrode.

An insulation electrode 28 permits of insulating the output well 19 from the reference well 29 situated under the floating electrode. When they are insulated, the evacuation well 18 and the output well 19 can be emptied with respect to their charge individually by means of the transistors T2 and T3, whose drains are connected to a potential VD. The transistor T3 may be omitted, in which event the output well is emptied in the transfer circuit by means of the transfer electrode. The charge emitter 10 receiving the radiation 11 is connected to the injection source 12 of the CTD. The storage electrode 16 can be divided into two electrodes, i.e. one for the evacuation well and the other for the output well, in order to independently control the depth of the output well.

The mode of operation of the CTD is as follows. The storage electrode 16 and the insulation electrode 28 are taken to a high potential to form the evacuation well 18 and the output well 19, which extends under the insulation electrode. The gate G2 is taken to a high potential to render T2 conducting in order to empty the well 18.

At an instant to, the gate G1 of T1 is taken to a high potential to render T1 conducting so that the floating gate 25 is precharged to a potential Vref-Vth identical to the potentials applied to the gates 16 and 28. Vth is the threshold voltage of the transistor T1. When the precharging of the floating electrode 25 is accomplished, the gate G1 is reset to a low potential (T1 non-conducting), which causes the floating electrode 25 to pass to a floating state. At this instant, the potentials of the electrodes 16, 27, 28 and 25 form a vast potential well devoid of electric charge. This is the state shown in FIG. 2A.

After a time t1, the transistor "T2" is reset to a cut-off state; the charge transferred from the emitter 10 is then stored gradually in the storage well and is uniformly distributed under the electrodes 16, 27, 28 and 25. This accumulation of charge involves a reduction of the potential of the floating electrode and consequently of the separation electrode 27 connected to it.

After a time $t_2$, the transistor "T2" is reset again to a conducting state, which thus permits the evacuation of the whole of the charge accumulated in the single evacuation well 18, whose volume proportioned by the potential of the electrode 27 is directly proportional to the quantity of charge supplied by the detector and injected into the semi-conductor of the input circuit.

After a time t3, the transistor "t2" is reset to a cut-off state. The charge continuously transferred from the emitter 10 is accumulated in a first period of time in the single evacuation well, the potential barrier formed by the electrode 27 and established by accumulated charge during the preceding cycle not being modified. Subsequently, the evacuation well being filled, the charge supplied by the emitter is again distributed under the assembly of the electrodes, which involves a new reduction of the potential of the floating electrode and hence of the separation electrode 27.

The cycles of resetting to zero of the well of evacuation and accumulation of the charge supplied by the detector are thus renewed for a number of times required for proportioning the evacuation well with the desired accuracy.

Figure 2B:
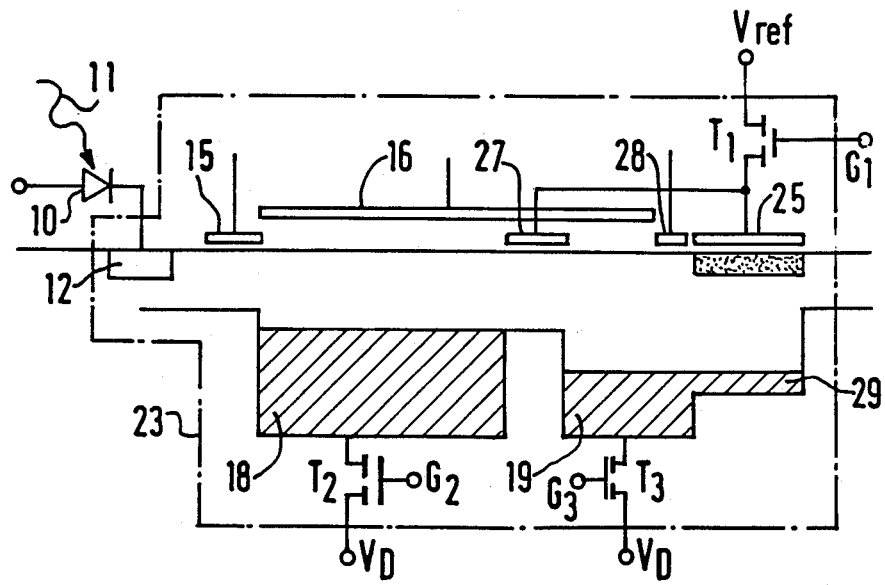

The input circuit of the CTD is then in the state shown in FIG. 2B.

This iterative mode of determining the dimension of the evacuation well is explained by the importance which the total background level and hence the number of charges resulting therefrom may have. The whole time period that will subsequently be necessary to analyse a picture point is thus decomposed into a given number of elementary time intervals depending upon the total sum of charges due to the background level and upon the surface area given to the electrodes defining the storage well. In this manner, a high degree of accuracy is obtained in determining the separation potential situated under the separation electrode.

Another possibility of proportioning the evacuation well consists in that a cut-off period of the transistor for resetting to zero of the well is used equal to the period of analysis of a picture point multiplied by the ratio between the surface areas of the electrodes 16,28,25 and the surface area of the part of the electrode 16 determining the surface area of the evacuation well 18. In this case, in a single operation a charge representative of the background level will be accumulated under te floating electrode 25 thus determining the separation potential situated under the separation electrode 27, which proportions the evacuation well 18.

The evacuation well being proportioned, the input circuit is ready for the analysis of the scene. The frequency of resetting to zero of the evacuation well is maintained within the measurement cycle. The insulation electrode 28 is reset to a low potential in order to insulate the reference well (in which a charge representative of the background current supplied by each CTD charge emitter is retained from the output well, in which the detected signal exceeding the background level will be accumulated. The reference and signal wells being insulated, the output well is reset ot zero by means of the transistor "T3" synchronously with the resetting to zero of the evacuation well or by the evacuation of the charge in the transfer circuit.

Figure 2C:
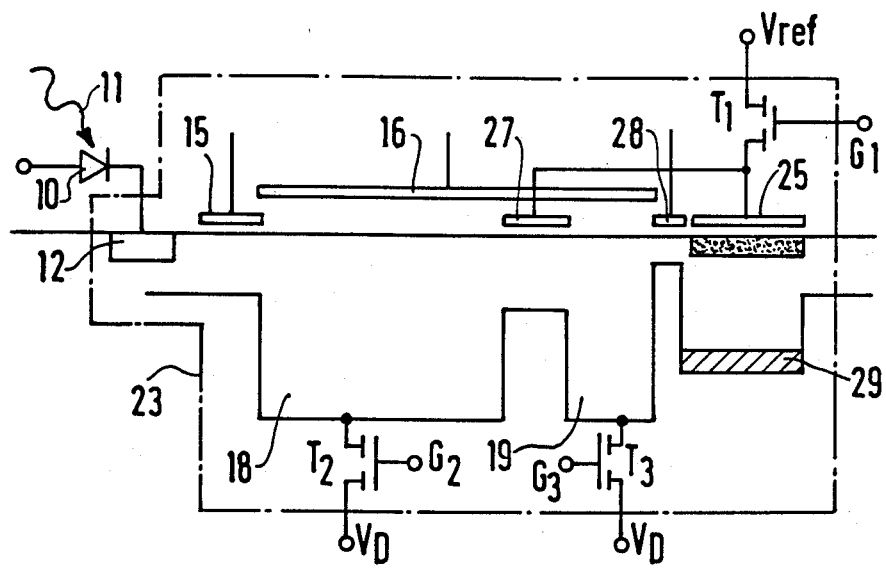

At the beginning of a sequence of picture analysis, each emitter is coupled to an input circuit, whose evacuation well is proportioned in accordance with the electrical characteristics associated with each emitter and with each injection source. The state shown in FIG. 2C is then obtained, in which the evacuation well and the output well are empty with respect to charge and the reference well is charged.

Figure 2D:
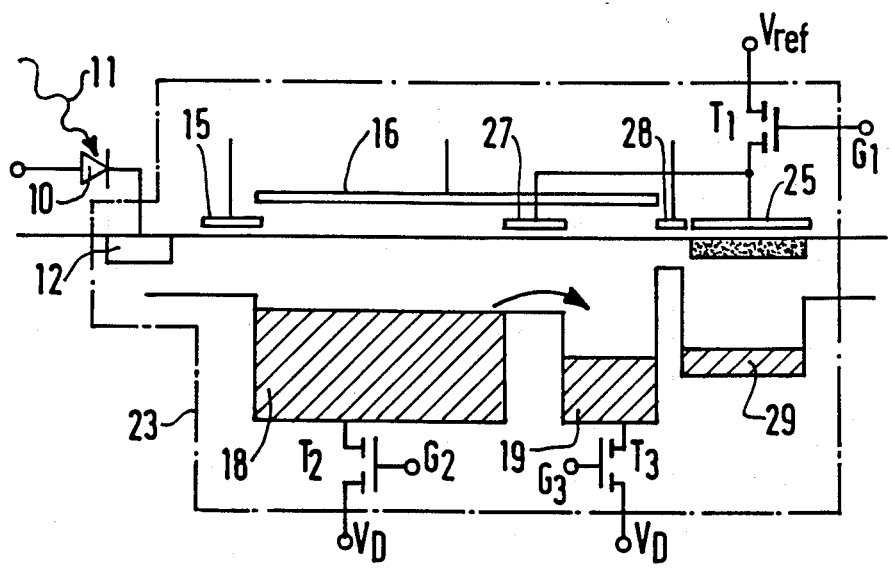

During an integration period T of the signal connected with the scene, the evacuation well is reset to zero periodically by periods T/N (N being an integer) in such a manner that the totality of the background level is subtracted. During this integration period T, only the charge originating from the "signal part" superimposed on the background level is poured out and is accumulated in the output well. The state shown in FIG. 2D is then obtained.

The charge contained in the output well is extracted by means of a transfer electrode and conducted to the transfer circuit of the CTD so as to be transferred to the output of the CTD and then processed by processing members so as to recover a picture of the analysed scene.

Figure 3A:
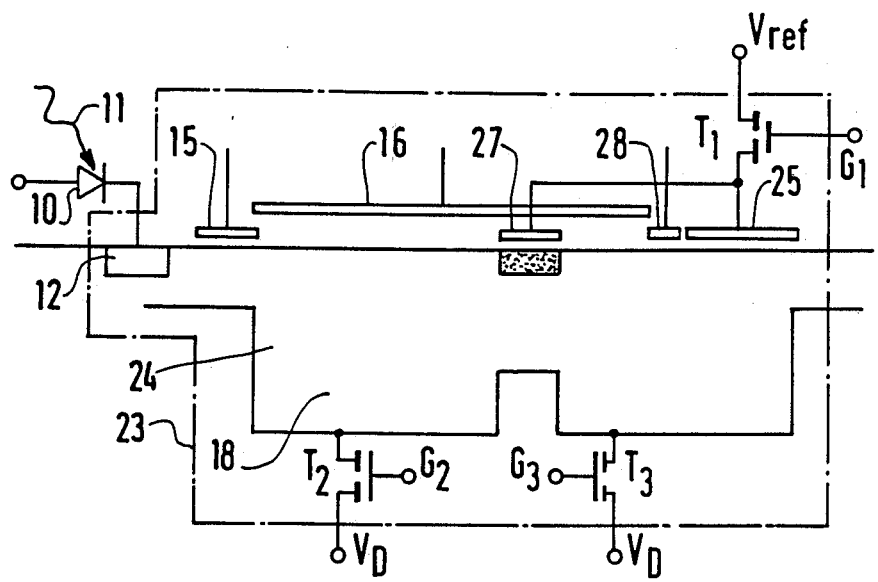
Figure 3B:
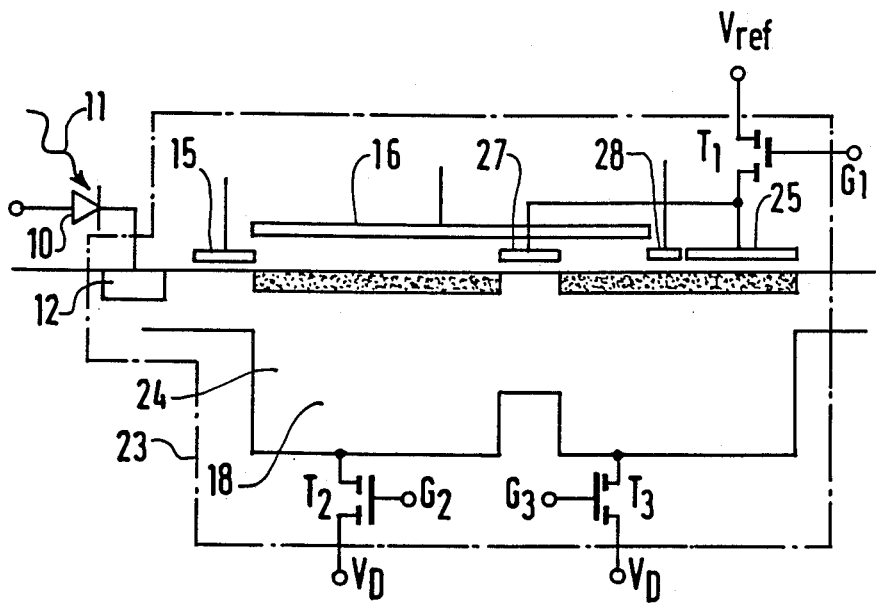

FIGS. 3A and 3B show another manner of forming the asymmetry between the potential wells situated under the floating electrode 25 and the separation electrode 27, respectively.

Thus, for FIG. 3A, for example in an N-channel device, it is possible to implant "acceptor" ions under the separation electrode 27 in order to fix thereto negative charge for increasing the flat band level.

In FIG. 3B, a similar result is obtained in that an implantation of "donor" ions is effected under the electrodes 16, 28 and 25 exclusive of the separation electrode 27.

It is possible to combine with each other the methods of doping, such as described in FIGS. 3A and 3B.

Clearly, with a substrate having a different doping type, the types of implantation are to be modified to obtain the asymmetries of potential wells described.

Figure 4:
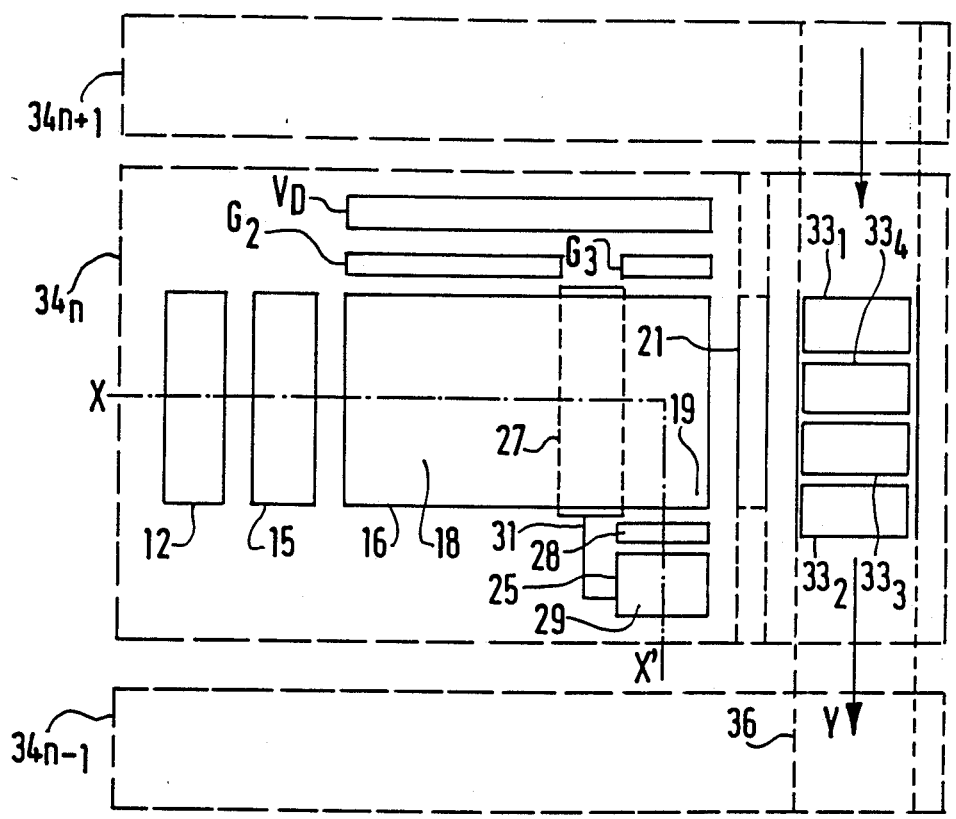

FIG. 4 shows diagrammatically a topologic embodiment of the circuit. FIGS. 2A to 2D show the diagram of the circuit obtained by taking a section XX' through FIG. 4. The elements are indicated therein with the same reference symbols. The injection source 12 charges the evacuation well 18 and the output well 19 by means of the control electrode 15. By means of the transfer electrode 21, the output well 19 can be transferred to the transfer wells situated, for example, under the four electrodes $33_1$ to $33_4$ of a four-phase device, which operates the conventional transfer from a CTD in the direction Y.

The insulation electrode 28 and the floating electrode 25 are arranged at a certain distance from the transfer path from the output well to the transfer wells. An electrical connection 31 connects the separation electrode 27 to the floating electrode 29.

Figure 5:
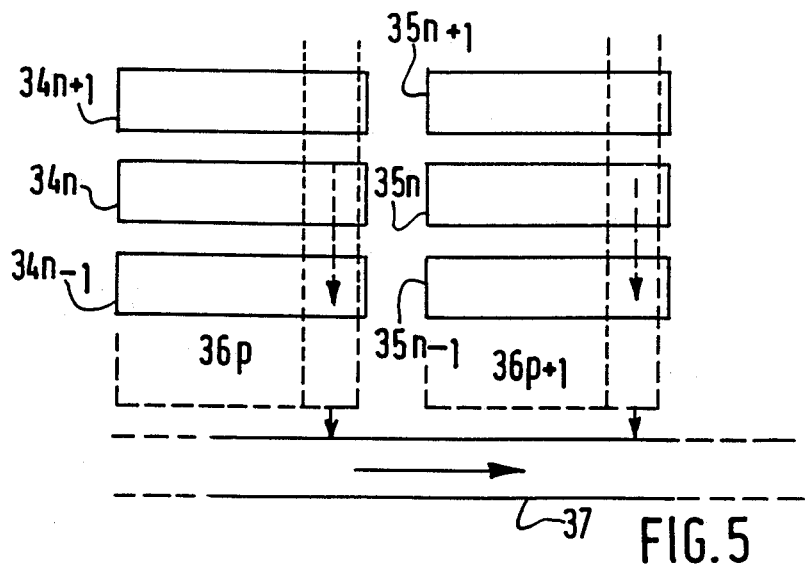

The charge transfer device $34_n$ eliminating the background level constitutes a basic element which can be reproduced n times, such as the devices $34_{n-1}$, $34_{n+1}$, to form a detection apparatus, which permits of analysing several picture points. All the transfer electrodes 21 and all the transfer wells are then interconnected in a continuous manner to form the transfer circuit 36 of the detection apparatus in order to carry out the evacuation of the charge to its output. These detection devices $34_{n-1}$, $34_n$, $34_{n+1}$ may also be reproduced identically p times to form a bidimensional arrangement ($34_{n-1}$, $35_{n-1}$...) ($34_n$, $35_n$...), ($34_{n+1}$, $35_{n+1}$...), which has its own transfer circuit 37 connected to all the transfer circuits $36_p$, $36_{p+1}$, of the detection devices, as indicated in FIG. 5.

What is claimed is:

1. A charge transfer device for reading out a radiation detector, comprising means for eliminating the background level of the radiation to be detected, and comprising an input circuit and a transfer circuit, formed in a semiconductor substrate, said input circuit comprising:

a charge injection source connected to said detector, which supplies a quantity of charge;

a storage electrode for forming a storage potential well in the semiconductor substrate in which electric charge injected by the source can be stored;

a control electrode between the source and the storage electrode, which permits injection of charge from the source into the storage potential well;

a separation electrode, isolated from the storage electrode for subdividing said storage well into an evacuation well and an output well separated from each other by a separation potential formed by said separation electrode, which permits retention in the evacuation well of a quality of charge to be evacuated and retention in the output well a quantity representative of the useful signal which is read by the transfer circuit, while the charge in the evacuation well can be evacuated by means of a reset transistor;

a floating electrode connected to the separation electrode for controlling the potential of the separation electrode, said potential of the separation electrode being determined during a calibration operation, said floating electrode being located besides the separation electrode, the doping under the floating electrode and the separation electrode being different from each other and such that potential wells under these electrodes have different depths; and and insulation electrode disposed between the separation electrode and the floating electrode, by means of which the well under the floating electrode and the output well can be separated from each other.

2. A charge transfer device as claimed in claim 1, characterized in that the semiconductor substrate is an N-channel semiconductor substrate and in that the potential well produced under the floating electrode is deeper than that produced under the separation electrode, this being obtained by overdoping by means of donor elements the part of the semiconductor substrate situated just under the floating electrode.

3. A charge transfer device as claimed in claim 1, characterized in that the semiconductor substrate is an N-channel semiconductor substrate and in that the potential well is produced under the floating electrode is deeper than that produced under the separation electrode, this being obtained by overdoping by means of acceptor elements the part of the semiconductor substrate situated just under the separation electrode.

4. A charge transfer device as claimed in claim 1, characterized in that the semiconductor substrate is an N-channel semiconductor substrate and in that the potential well produced under the floating electrode is deeper than that produced under the separation electrode, this being obtained by overdoping by means of donor elements the part of the semiconductor substrate situated just under the floating electrode, the insulation electrode and the storage electrode exclusive of the part situated under the separation electrode.

5. A charge transfer device as claimed in claim 1, characterized in that the semiconductor substrate is an N-channel semiconductor substrate and in that the potential well produced under the floating electrode is deeper than that produced under the separation electrode, this being obtained by overdoping by means of donor elements the part of the semiconductor substrate situated just under the floating electrode, the insulation electrode and the storage electrode, and by doping by means of acceptor elements the parts of the semiconductor substrate situated just below the separation electrode.

6. A charge transfer device as claimed in claim 1, characterized in that the output well is discharged by means of a transistor.

7. A charge transfer device as claimed in claim 1, characterized in that the output well is discharged into the transfer circuit by means of the transfer electrode.

8. A detection apparatus, characterized in that it comprises n charge transfer devices (CTD's) as claimed in claim 1, each injection source of each CTD being connected individually to a charge emitter.

9. A detection apparatus as claimed in claim 8, characterized in that the n charge transfer devices are repeated p times in order to permit bidimensional arrangement of picture points formed by the n x p devices.

10. A detection apparatus as claimed in claim 8, characterized in that the charge emitter is constituted by diode sensitive to infrared radiation.

11. A detection apparatus as claimed in claim 10, characterized in that the diode is a diode of $Cd_xHg_{1-x}Te$ or of InSb.

* * * * *